US012772734B2

(12) United States Patent
Tanaka et al.

(10) Patent No.: US 12,772,734 B2
(45) Date of Patent: Oct. 20, 2026

(54) MAGNETIC-THIN-FILM-EQUIPPED SUBSTRATE, MAGNETIC THERMOELECTRIC CONVERSION ELEMENT, SENSOR, AND METHOD FOR MANUFACTURING MAGNETIC-THIN-FILM-EQUIPPED SUBSTRATE

(71) Applicant: NITTO DENKO CORPORATION, Ibaraki (JP)

(72) Inventors: Hirokazu Tanaka, Ibaraki (JP); Manami Kurose, Ibaraki (JP); Yosuke Nakanishi, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 187 days.

(21) Appl. No.: 18/852,600

(22) PCT Filed: Mar. 30, 2023

(86) PCT No.: PCT/JP2023/013400
§ 371 (c)(1),
(2) Date: Sep. 30, 2024

(87) PCT Pub. No.: WO2023/190993
PCT Pub. Date: Oct. 5, 2023

(65) Prior Publication Data
US 2025/0241206 A1 Jul. 24, 2025

(30) Foreign Application Priority Data
Mar. 30, 2022 (JP) ................................ 2022-056908

(51) Int. Cl.
*H02K 15/20* (2025.01)
*G01K 7/36* (2006.01)
*H10N 15/20* (2023.01)

(52) U.S. Cl.
CPC .............. *H10N 15/20* (2023.02); *G01K 7/36* (2013.01)

(58) Field of Classification Search
CPC ................................ G01K 7/36; H10N 15/20
See application file for complete search history.

(56) References Cited

U.S. PATENT DOCUMENTS

2012/0012954 A1 1/2012 Yamada et al.
2016/0155919 A1* 6/2016 Kinoshita ............. H10N 15/00 252/62.55

(Continued)

FOREIGN PATENT DOCUMENTS

EP 4383994 A1 6/2024
JP 2014-72256 A 4/2014

(Continued)

OTHER PUBLICATIONS

The Extended European Search Report issued on Mar. 5, 2026 for corresponding European Patent Application No. 23781001.5 (10 pages).

(Continued)

*Primary Examiner* — Rashad H Johnson
(74) *Attorney, Agent, or Firm* — Hauptman Ham, LLP

(57) ABSTRACT

A magnetic-thin-film-equipped substrate includes a substrate and a magnetic thin film. A difference obtainable by subtracting a first internal stress of the magnetic thin film from a second internal stress of the magnetic thin film is 50 MPa or more. The first internal stress is an internal stress of the magnetic thin film in a first direction along a surface of the magnetic thin film extending in parallel with the sub- (Continued)

strate. The second internal stress is the internal stress of the magnetic thin film in a second direction parallel to the surface and perpendicular to the first direction.

17 Claims, 6 Drawing Sheets

(56) References Cited

U.S. PATENT DOCUMENTS

| | | | | |
|---|---|---|---|---|
| 2021/0190886 | A1 | 6/2021 | Tatematsu et al. | |
| 2022/0246820 | A1 * | 8/2022 | Nakatsuji | H10N 15/00 |
| 2022/0326094 | A1 * | 10/2022 | Kirihara | G01K 17/06 |
| 2022/0381853 | A1 * | 12/2022 | Endo | G01R 33/063 |
| 2023/0020837 | A1 * | 1/2023 | Endo | H10N 50/10 |
| 2023/0180614 | A1 * | 6/2023 | Nakatsuji | H10N 15/00 310/306 |
| 2024/0068881 | A1 * | 2/2024 | Maeda | G01K 7/02 |
| 2024/0284798 | A1 * | 8/2024 | Uchida | H10N 15/00 |
| 2024/0341191 | A1 * | 10/2024 | Tanaka | H02N 11/002 |
| 2024/0341192 | A1 * | 10/2024 | Nakatsuji | H02N 11/00 |
| 2024/0341193 | A1 * | 10/2024 | Nakatsuji | H10N 15/00 |
| 2025/0008841 | A1 * | 1/2025 | Kurose | H10N 15/20 |
| 2025/0017111 | A1 * | 1/2025 | Tanaka | H10N 15/00 |
| 2025/0241206 | A1 * | 7/2025 | Tanaka | H10N 15/00 |
| 2026/0138358 | A1 * | 5/2026 | Ogihara | B32B 27/08 |

FOREIGN PATENT DOCUMENTS

| | | | |
|---|---|---|---|
| JP | 2018-503824 | A | 2/2018 |
| WO | 2010/026831 | A1 | 3/2010 |
| WO | 2016/113618 | A1 | 7/2016 |
| WO | 2020/090333 | A1 | 5/2020 |
| WO | 2020/218613 | A1 | 10/2020 |
| WO | 2023/013704 | A1 | 2/2023 |

OTHER PUBLICATIONS

Tien et al., "Evaluation of Electrical, Mechanical Properties, and Surface Roughness of DC Sputtering Nickel-Iron Thin Films", IEEE Transactions on Magnetics, vol. 50, No. 7, Jul. 2014, 2005304 (4 pages).

Ross, "Anisotropic Stress in Window-Plated Permalloy Thin Films", IEEE Transactions on Magnetics, vol. 29, No. 5, Sep. 1993, pp. 2266-2272(7 pages).

Jen et al., "Magneto-elastic and magnetic domain properties of Fe81Ga19/Si(100) films", Journal of Applied Physics, vol. 115, pp. 013909-1~013909-5, Jan. 7, 2014 (5 pages).

Gueye et al., "Ferromagnetic resonance in thin films submitted to multiaxial stress state: application of the uniaxial equivalent stress concept and experimental validation", Journal of Physics D: Applied Physics, vol. 49, 265001, May 26, 2016 (7 pages).

Dai et al., "Mechanically tunable magnetic properties of Fe81Ga19 films grown on flexible substrates", Applied Physics Letters, vol. 100, Mar. 21, 2012, pp. 122407-1~122407-4 (4 pages).

Melo et al., "Anomalous Nernst effect in stressed magnetostrictive film grown onto flexible substrate", Scientific Reports, vol. 9, 15338, Oct. 25, 2019 (12 pages).

Wen et al., "Determination of stress-coefficient of magnetoelastic anisotropy in flexible amorphous CoFeB film by anisotropic magnetoresistance", Applied Physics Letters, vol. 111, pp. 142403-1~142403-5, Oct. 3, 2017 (5 pages).

International Search Report issued for corresponding International Patent Application No. PCT/JP2023/013400 on Jun. 27, 2023, along with an English translation (5 pages).

Written Opinion issued for corresponding International Patent Application No. PCT/JP2023/013400 on Jun. 27, 2023 (9 pages).

* cited by examiner

MAGNETIC-THIN-FILM-EQUIPPED SUBSTRATE, MAGNETIC THERMOELECTRIC CONVERSION ELEMENT, SENSOR, AND METHOD FOR MANUFACTURING MAGNETIC-THIN-FILM-EQUIPPED SUBSTRATE

CROSS REFERENCE TO RELATED APPLICATION

This application is a National Stage of International Application No. PCT/JP2023/013400, filed on Mar. 30, 2023, which designates the United States and was published in Japan, and which is based upon and claims priority to Japanese Patent Application No. 2022-056908, filed on Mar. 30, 2022 in the Japan Patent Office. All of the aforementioned applications are hereby incorporated by reference in their entireties.

TECHNICAL FIELD

The present invention relates to a magnetic-thin-film-equipped substrate, a magnetic thermoelectric conversion element, a sensor, and a method for manufacturing a magnetic-thin-film-equipped substrate.

BACKGROUND ART

Techniques regarding magnetic thermoelectric conversion have been known.

For example, Patent Literature 1 describes a thermoelectric generation device using anomalous Nernst effect. The anomalous Nernst effect is a phenomenon that, when a metal or a semiconductor with spontaneous magnetization has a temperature difference in a direction perpendicular to the spontaneous magnetization, a potential difference is generated in a cross product direction thereof.

The thermoelectric generation device has a substrate, a power generating body, and a connecting body. For example, at least a surface layer of the substrate consists of MgO. The power generating body includes a plurality of fine wires arranged parallel to each other along the surface of the substrate. The power generating body includes an L10-ordered alloy having a high magnetic anisotropy. For example, alloys such as FePt, CoPt, FePd, CoPd, FeNi, MnAl, or MnGa may be used as the L10-ordered alloy. The L10-ordered alloy as the power generating body has a high magnetic anisotropy. By orientating the easy axis of magnetization of the L10-ordered alloy in the width direction of the fine wire, for example, spontaneous magnetization can be obtained even if the width of the fine wire is narrowed down to several tens of nanometers.

CITATION LIST

Patent Literature

Patent Literature 1: JP 2014-72256 A

SUMMARY OF INVENTION

Technical Problem

There is a growing need for thermal monitoring such as health monitoring in the Internet of Things (IoT) society or in thermal management in some technical fields such as batteries for electric vehicles (EVs) and high-speed data processing chips. To meet these needs, it is conceivable to use thermoelectric conversion elements for heat sensing.

It is understood that magnetic thermoelectric conversion elements using magnetic thermoelectric conversion, such as the thermoelectric conversion device described in Patent Literature 1, can be produced more easily in comparison with thermoelectric generation devices using the Seebeck effect. Based on these advantages, it is conceivable to use magnetic thermoelectric conversion elements utilizing magnetic thermoelectric conversion for heat sensing.

As described in Patent Literature 1, it is conceivable to form a magnetic thermoelectric conversion body of the magnetic thermoelectric conversion element as a thin wire. If the magnetization direction of the magnetic thermoelectric conversion body is parallel to the width direction of the fine wire, an electromotive force is generated in the longitudinal direction of the fine wire due to magnetic thermoelectric effects such as the anomalous Nernst effect, and the output of a sensor including the magnetic thermoelectric conversion element is likely to increase. On the other hand, considering a shape magnetic anisotropy, the hard axis of the magnetic thermoelectric conversion body is likely to occur in the width direction of the fine wire. If the hard axis occurs in the width direction of the thin wire, the magnetic thermoelectric conversion element is unlikely to exhibit a stable behavior with respect to an external magnetic field.

In the thermoelectric conversion device described in Patent Literature 1, the easy axis of magnetization is oriented in the width direction of the fine wire, using an L10-ordered alloy having a high magnetic anisotropy. Therefore, the thermoelectric conversion device described in Patent Literature 1 imposes restrictions on the material of the power generating body. In addition, in the case of forming a thin film of the L10-ordered alloy, it is necessary to use a substrate having an anisotropic orientation in the in-plane direction of a single-crystal substrate or the like to provide an anisotropy in the in-plane direction of the thin film. This imposes also a significant restriction on the selection of substrate.

In view of these circumstances, the present invention provides a magnetic-thin-film-equipped substrate that is advantageous from the viewpoint of generating the desired magnetic anisotropy while decreasing restrictions to be imposed on the substrate and the material.

Solution to Problem

The present invention provides a magnetic-thin-film-equipped substrate, including:

a substrate; and a magnetic thin film disposed on the substrate, wherein a difference obtainable by subtracting a first internal stress of the magnetic thin film from a second internal stress of the magnetic thin film is 50 MPa or more, the first internal stress is an internal stress of the magnetic thin film in a first direction along a surface of the magnetic thin film extending in parallel with the substrate, and the second internal stress is an internal stress of the magnetic thin film in a second direction parallel to the surface and perpendicular to the first direction.

The present invention provides a magnetic thermoelectric conversion element including the aforementioned magnetic-thin-film-equipped substrate, wherein the magnetic thin film includes a magnetic thermoelectric conversion body capable of generating a thermoelectromotive force in a direction perpendicular to a heat flow.

The present invention provides a sensor including the aforementioned magnetic thermoelectric conversion element.

The present invention provides a method for manufacturing a magnetic-thin-film-equipped substrate, the method including:

forming a magnetic thin film on one principal surface of a substrate; and heating the substrate and the magnetic thin film at a predetermined temperature, wherein a difference obtainable by subtracting a first dimensional change rate from a second dimensional change rate is 0.10% or more, the first dimensional change rate is a value obtainable, in a test of heating the substrate at 150° C. for 30 minutes, by dividing a dimension of the substrate measured at 25° C. after the test by a dimension of the substrate measured at 25° C. before the test, where both the dimensions are measured in a first direction along the principal surface of the substrate, and the second dimensional change rate is a value obtainable by dividing a dimension of the substrate measured at 25° C. after the test by a dimension of the substate measured at 25° C. before the test, where both the dimensions are measured in a second direction parallel to the principal surface of the substrate and perpendicular to the first direction.

Advantageous Effects of Invention

The magnetic-thin-film-equipped substrate is advantageous from the viewpoint of generating a desired magnetic anisotropy while decreasing restrictions on the substrate and the material.

DESCRIPTION OF EMBODIMENTS

Hereinafter, embodiments of the present invention will be described with reference to the attached drawings. The present invention is not limited to the following embodiments.

Figure 1:
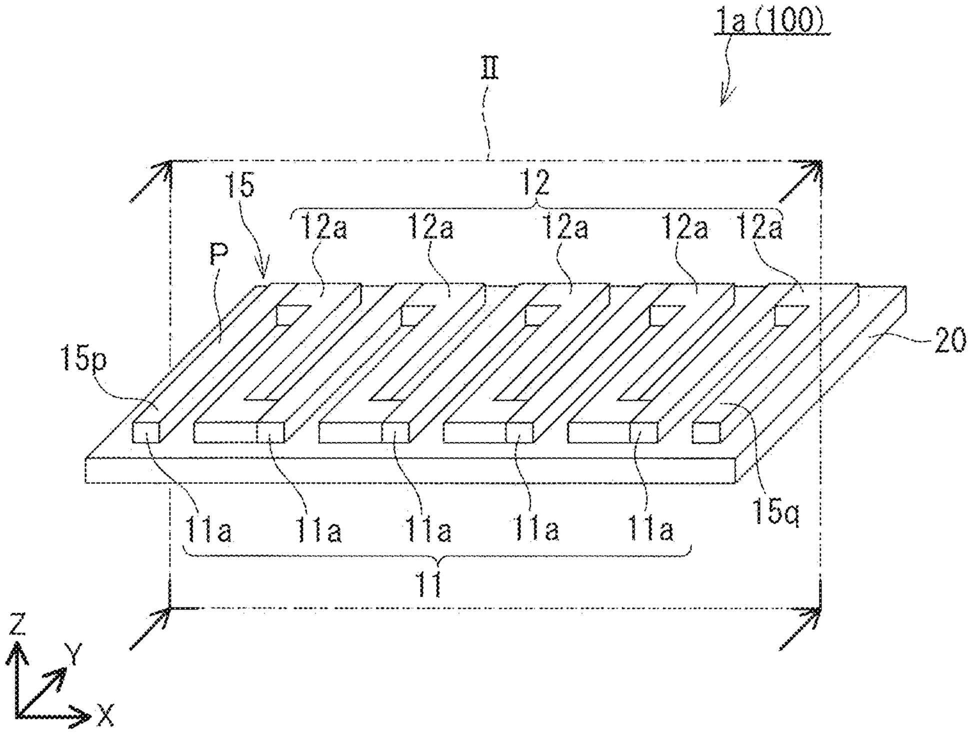
FIG. 1 is a perspective view showing an example of an embodiment of a magnetic-thin-film-equipped substrate.
Figure 2:
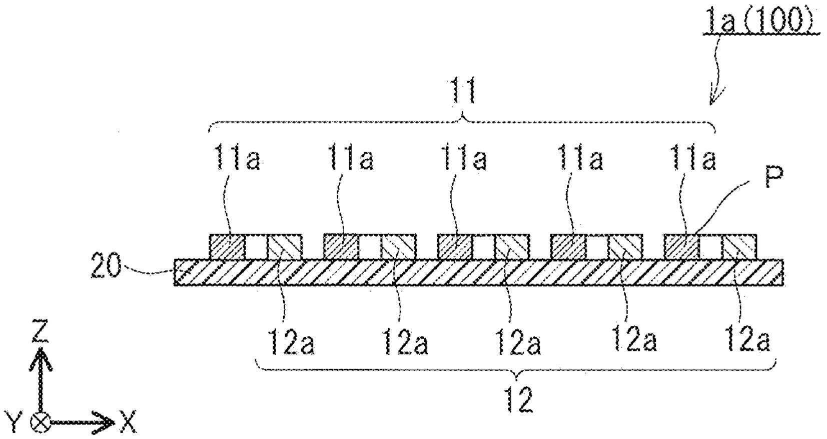
FIG. 2 is a cross-sectional view of the magnetic-thin-film-equipped substrate shown in FIG. 1, taking a plane II as the cross section.

As shown in FIG. 1 and FIG. 2, a magnetic-thin-film-equipped substrate 1*a* includes a substrate 20 and a magnetic thin film 11. The magnetic thin film 11 is disposed on the substrate 20. In FIG. 1 and FIG. 2, the X-axis, the Y-axis and the Z-axis are orthogonal to each other. In the magnetic thin film 11, a difference $\sigma_x - \sigma_y$ obtainable by subtracting a first internal stress $\sigma_y$ from a second internal stress $\sigma_x$ is 50 MPa or more. The first internal stress $\sigma_y$ is an internal stress of the magnetic thin film 11 in a first direction (Y-axis direction). The first direction is along a surface P of the magnetic thin film 11 extending parallel to the substrate 20. The second internal stress $\sigma_x$ is an internal stress of the magnetic thin film 11 in a second direction (X-axis direction). The second direction is a direction parallel to the surface P and perpendicular to the first direction. In this Description, a positive value of the internal stress indicates a tensile stress, and a negative value of the internal stress indicates a compressive stress.

As shown in FIG. 1, the magnetic thin film 11 has, for example, a positive value magnetostriction constant and extends linearly in the first direction (Y-axis direction). Therefore, considering the shape magnetic anisotropy, seemingly in the magnetic thin film 11, an easy axis occurs in the first direction and a hard axis occurs in the second direction. However, in the magnetic thin film 11, since the difference $\sigma_x - \sigma_y$ is 50 MPa or more, the magnetic properties of magnetic thin film 11 have a large anisotropy in the second direction and in the first direction. For example, a magnetic anisotropy energy $E_u$ of the magnetic body has a relation $E_u = (3/2)\lambda\sigma$. In this relation, $\lambda$ is a magnetostriction constant of the magnetic body, and $\sigma$ is the internal stress of the magnetic body. Therefore, it is understood that when the difference $\sigma_x - \sigma_y$ is larger, the anisotropy of the magnetic properties of the magnetic thin film 11 in the second direction and in the first direction becomes larger.

Figure 3A:
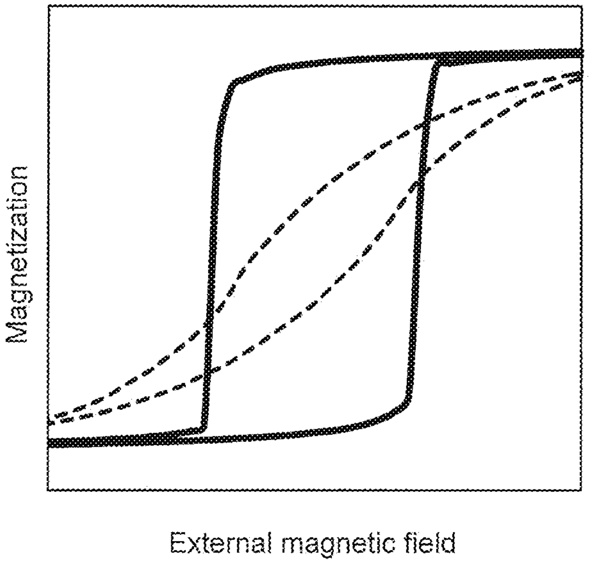
FIG. 3A is a graph showing a relation between magnetization of the magnetic thin film according to an embodiment and an external magnetic field.

FIG. 3A is a graph showing a relation between magnetization of the magnetic thin film 11 and an external magnetic field. In FIG. 3A, the graph of solid lines indicates a relation between the magnetization of the magnetic thin film 11 in the second direction (X-axis direction) and the external magnetic field. The graph of dashed lines indicates a relation between the magnetization of the magnetic thin film 11 in the first direction (Y-axis direction) and the external magnetic field. As shown in FIG. 3A, the magnetic properties of the magnetic thin film 11 have a large anisotropy in the second direction and in the first direction because the difference $\sigma_x - \sigma_y$ is 50 MPa or more in the magnetic thin film 11. Due to the large anisotropy of the magnetic properties, in the magnetic thin film 11, a hard axis is likely to occur in the first direction and an easy axis is likely to occur in the second direction. Thereby, the magnetic-thin-film-equipped substrate 1*a* is likely to exhibit a stable behavior with respect to the external magnetic field. Further, adjustment of the difference $\sigma_x - \sigma_y$ in the magnetic thin film 11 to be 50 MPa or more is unlikely to impose restrictions on the materials of the substrate 20 and the magnetic thin film 11. In addition, by adjusting the $\sigma_x - \sigma_y$ to 50 MPa or more, the magnetic properties are likely to have a large anisotropy without the need for any external stress, and the influence of external stress is likely to be mitigated, thereby easily decreasing the restriction on the attachment of the magnetic-thin-film-equipped substrate 1*a* and the restriction on the use of the magnetic-thin-film-equipped substrate 1*a*.

Figure 3B:
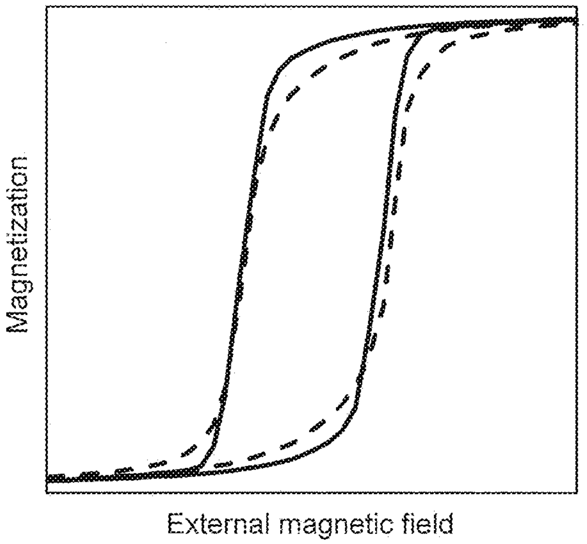
FIG. 3B is a graph showing a relation between magnetization of a magnetic thin film according to Reference Example and a magnetic field.

FIG. 3B is a graph showing a relation between magnetization of the magnetic thin film according to Reference Example and an external magnetic field. The magnetic thermoelectric conversion body according to Reference Example is configured similarly to the magnetic thin film 11 except for the parts that will be specifically stated. In FIG. 3B, the graph of solid lines indicates a relation between magnetization of the magnetic thermoelectric conversion body in the second direction according to Reference Example and the external magnetic field. The graph of dashed lines indicates a relation between magnetization of the magnetic thermoelectric conversion body in the first direction according to Reference Example and the external magnetic field. As to the magnetic thermoelectric conversion body according to Reference Example, the difference $\sigma_x-\sigma_y$ is less than 50 MPa. As a result, as shown in FIG. 3B, the anisotropy of the magnetic properties in the second direction and in the first direction of the magnetic thermoelectric conversion body according to Reference Example is small. For this reason, the magnetic thermoelectric conversion body according to Reference Example is likely to have an easy axis in the first direction and a hard axis in the second direction, based on the shape magnetic anisotropy. As a result, the magnetic thermoelectric conversion element including the magnetic thermoelectric conversion body according to Reference Example is unlikely to exhibit a stable behavior with respect to the external magnetic field.

Figure 4:
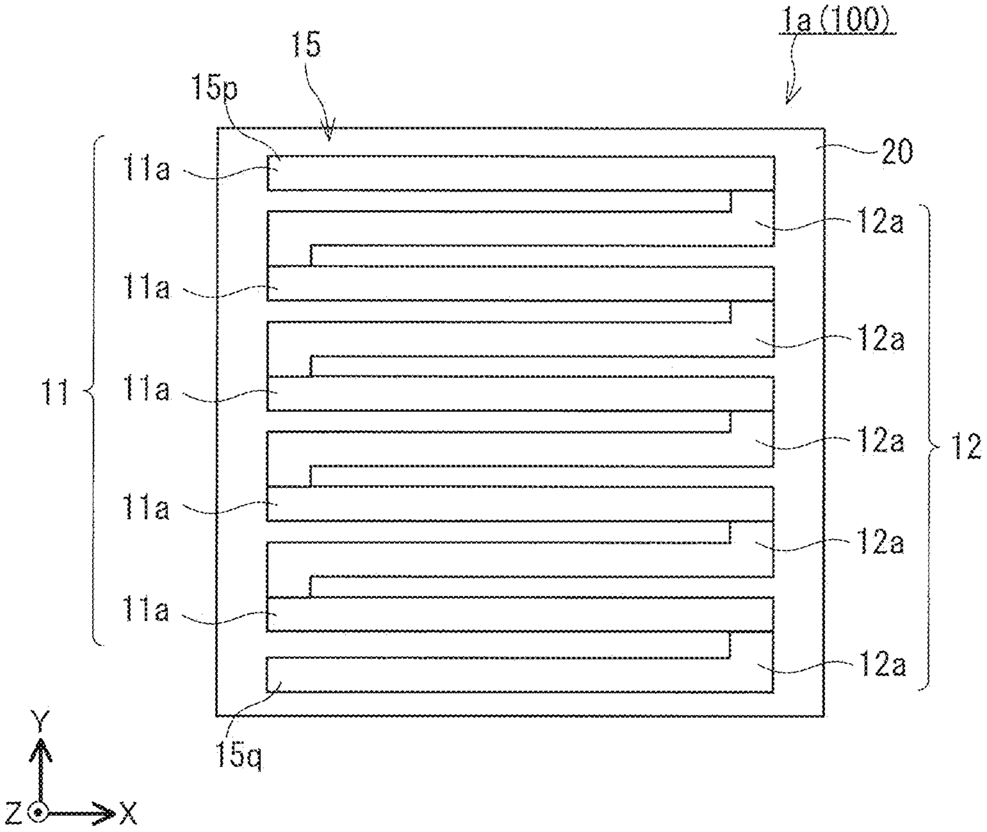
FIG. 4 is a perspective view showing another example of an embodiment of a magnetic-thin-film-equipped substrate.

The magnetic thin film 11 may have a magnetostriction constant of a negative value. In this case, as shown in FIG. 4, in the magnetic-thin-film-equipped substrate 1*a*, the magnetic thin film 11 extends linearly in the second direction (X-axis direction). In this case, the graph of solid lines in FIG. 3A indicates a relation between the magnetization of the magnetic thin film 11 in the first direction (Y-axis direction) and the external magnetic field. The graph of dashed lines indicates a relation between the magnetization of the magnetic thin film 11 in the second direction (X-axis direction) and the external magnetic field. In the magnetic thin film 11, the difference $\sigma_x-\sigma_y$ is 50 MPa or more, so that the magnetic properties of the magnetic thin film 11 have a large anisotropy in the second direction and in the first direction. Due to such a large anisotropy of the magnetic properties, in the magnetic thin film 11, a hard axis is likely to occur in the second direction and an easy axis is likely to occur in the first direction. Thereby, the magnetic-thin-film-equipped substrate 1*a* is likely to exhibit a stable behavior with respect to the external magnetic field.

The difference $\sigma_x-\sigma_y$ may be 100 MPa or more, may be 150 MPa or more, or may be 200 MP or more. The upper limit of the difference $\sigma_x-\sigma_y$ is not limited to a particular value. The difference $\sigma_x-\sigma_y$ is, for example, 900 MPa or less. In this case, cracks are unlikely to occur in the magnetic thin film 11 even if bending loads are applied to both ends of the magnetic thin film 11 in the second direction.

The first internal stress $\sigma_y$ may be a tensile stress or a compressive stress. The first internal stress $\sigma_y$ is, for example, 900 MPa or less. This makes it easy to adjust the difference $\sigma_x-\sigma_y$ to 50 MPa or more. In addition, cracks are unlikely to occur in the magnetic thin film 11 even if bending loads are applied to both ends of the magnetic thin film 11 in the first direction. The first internal stress $\sigma_y$ may be 700 MPa or less, may be 500 MPa or less, or may be 300 MPa or less. The first internal stress $\sigma_y$ is, for example, −900 MPa or more. The first internal stress $\sigma_y$ may be −700 MPa or more, may be −500 MPa or more, or may be −300 MPa or more. The first internal stress $\sigma_y$ may be included in any ranges determined by all combinations of a lower limit value and an upper limit value, where the lower limit value is any one of −900 MPa, −700 MPa, −500 MPa, and −300 MPa, and the upper limit value is any one of 900 MPa, 700 MPa, 500 MPa, and 300 MPa.

The second internal stress $\sigma_x$ may be a tensile stress or a compressive stress. The second internal stress $\sigma_x$ is, for example, −900 MPa or more. This makes it easy to adjust the difference $\sigma_x-\sigma_y$ to 50 MPa or more. The second internal stress $\sigma_x$ may be −700 MPa or more, may be −500 MPa or more, or may be −300 MPa or more.

The second internal stress $\sigma_x$ is, for example, 900 MPa or less. In this case, cracks are unlikely to occur in the magnetic thin film 11 even if bending loads are applied to both ends of the magnetic thin film 11 in the second direction. The second internal stress $\sigma_x$ may be 700 MPa or less, may be 500 MPa or less, or may be 300 MPa or less. The second internal stress $\sigma_x$ may be included in any of the ranges determined by all combinations of a lower limit value and an upper limit value, where the lower limit value is any one of −900 MPa, −700 MPa, −500 MPa, and −300 MPa, and the upper limit value is any one of 900 MPa, 700 MPa, 500 MPa, and 300 MPa.

The thickness of the magnetic thin film 11 is not limited to a specific value. For example, the magnetic thin film 11 has a thickness of 5 to 1000 nm. With this configuration, the magnetic thin film 11 is more susceptible to shrinkage after thermal expansion of the substrate 20, so that the internal stress in the magnetic thin film 11 can be easily adjusted to a desired range.

The thickness of the magnetic thin film 11 may be 750 nm or less, may be 500 nm or less, may be 400 nm or less, may be 300 nm or less, or may be 200 nm or less. The thickness of the magnetic thin film 11 may be 10 nm or more, may be 20 nm or more, may be 30 nm or more, or may be 50 nm or more. The thickness of the magnetic thin film 11 may be included in any ranges determined by all combinations of a lower limit value and an upper limit value, where the lower limit value is any one of 5 nm, 10 nm, 20 nm, 30 nm, and 50 nm, and the upper limit value is any one of 1000 nm, 750 nm, 500 nm, 400 nm, 300 nm, and 200 nm.

A squareness ratio determined by a M-H curve in the first direction and in the second direction in the magnetic thin film 11 is not limited to a particular value. The magnetic thin film 11 satisfies, for example, one of the following requirements (a) and (b). The squareness ratio is a ratio Mr/Ms, namely, a ratio of a remanent magnetization Mr to a saturation magnetization Ms on a M-H curve. In this case, as shown in FIG. 3A, the magnetic properties of the magnetic thin film 11 are likely to have a large anisotropy in the second direction and in the first direction.

(a) A squareness ratio determined by the M-H curve in the first direction is 0.7 or less.

(b) A squareness ratio determined by the M-H curve in the second direction is 0.7 or less.

For example, in the case where the requirement (a) is satisfied, a high magnetic anisotropy is likely to develop in the second direction. Similarly for example, in the case of forming a thin wire of the magnetic thin film 11 extending in the first direction, influences of the shape magnetic anisotropy are unlikely to occur and a high magnetic anisotropy may be easily applied in the second direction. For example, the requirement (a) is satisfied in the case where the magnetostriction constant of the magnetic thin film 11 is a positive value.

For example, in the case where the requirement (b) is satisfied, a high magnetic anisotropy is likely to develop in the first direction. For example, in the case of forming a thin wire of the magnetic thin film 11 extending in the second direction, influences of the shape magnetic anisotropy are unlikely to occur and a high magnetic anisotropy may be easily applied in the first direction. For example, the requirement (b) is satisfied in the case where the magnetostriction constant of the magnetic thin film 11 is a negative value.

In the case where the requirements (a) and (b) are satisfied, the squareness ratio may be 0.65 or less, 0.60 or less, 0.55 or less, 0.50 or less, 0.4 or less, or 0.3 or less. The squareness ratio is, for example, 0.1 or more.

The substrate 20 has, for example, flexibility. The substrate 20 has, for example, a flat principal surface. The surface P may be parallel to this principal surface. The substrate 20 has elasticity such that a strip-like specimen made from the substrate 20 can be elastically deformed when the specimen is wound around a cylindrical mandrel having a diameter of 10 cm, for example, so that the both ends in the length direction of the specimen will be oriented in the same direction.

The linear expansion coefficient of the substrate 20 is not limited to a specific value. For example, $|CTE_2-CTE_1|$, which is the absolute value of a difference between the second linear expansion coefficient $CTE_2$ of the substrate 20 and the first linear expansion coefficient $CTE_1$ of the substrate 20, is $20\times10^{-6}$/° C. or more. The first linear expansion coefficient $CTE_1$ is an average value of the linear expansion coefficient of the substrate 20 in the first direction in a range of a temperature higher by 5° C. than a glass transition temperature Tg of the substrate 20 to a temperature higher by 55° C. than the glass transition temperature Tg (Tg+5° C.≤T≤Tg+55° C.). The second linear expansion coefficient $CTE_2$ is an average value of the linear expansion coefficients of the substrate 20 in the second direction in the aforementioned temperature range (Tg+5° C.≤T≤Tg+55° C.). With this configuration, the difference $\sigma_x-\sigma_y$ can be easily adjusted to 50 MPa or more, because the state of stress to be applied to the magnetic thin film 11 in the first direction is different from that in the second direction, where the stress is generated due to a thermal expansion of the substrate 20 at the time of forming the magnetic thin film 11 and a subsequent lowering in temperature of the substrate 20.

The absolute value $|CTE_2-CTE_1|$ may be $30\times10^{-6}$/° C. or higher, may be $40\times10^{-6}$/° C. or higher, may be $50\times10^{-6}$/° C. or higher, may be $100\times10^{-6}$/° C. or higher, may be $110\times10^{-6}$/° C. or higher, may be $120\times10^{-6}$/° C. or higher, may be $150\times10^{-6}$/° C. or higher, may be $200\times10^{-6}$/° C. or higher, or may be $300\times10^{-6}$/° C. or higher. The absolute value $|CTE_2-CTE_1|$ is, for example, $500\times10^{-6}$/° C. or lower.

The first linear expansion coefficient $CTE_1$ is not limited to a specific value. The first linear expansion coefficient $CTE_1$ is, for example, in a range of $1\times10^{-6}$° C. to $300\times10^{-6}$/° C. The first linear expansion coefficient $CTE_1$ may be, for example in a range whose upper and lower limits are specified by a combination of any two values selected from the group consisting of $1\times10^{-6}$/° C., $10\times10^{-6}$/° C., $20\times10^{-6}$/° C., $30\times10^{-6}$/° C., $40\times10^{-6}$/° C., $50\times10^{-6}$/° C., $60\times10^{-6}$/° C., $70\times10^{-6}$/° C., $80\times10^{-6}$/° C., $90\times10^{-6}$/° C., $100\times10^{-6}$° C., $150\times10^{-6}$/° C., $200\times10^{-6}$/° C., $250\times10^{-6}$/° C., and $300\times10^{-6}$/° C. For example, the range of $1\times10^{-6}$/° C. to $10\times10^{-6}$/° C. is identified by a combination of two values of $1\times10^{-6}$/° C. and $10\times10^{-6}$/° C.

The second linear expansion coefficient $CTE_2$ is not limited to a specific value. The second linear expansion coefficient $CTE_2$ is, for example, in a range of $1\times10^{-6}$/° C. to $300\times10^{-6}$/° C. The second linear expansion coefficient $CTE_2$ may be, for example in a range whose upper and lower limits are specified by a combination of any two values selected from the group consisting of $1\times10^{-6}$/° C., $10\times10^{-6}$/° C., $20\times10^{-6}$/° C., $30\times10^{-6}$/° C., $40\times10^{-6}$/° C., $50\times10^{-6}$/° C., $60\times10^{-6}$/° C., $70\times10^{-6}$/° C., $80\times10^{-6}$/° C., $90\times10^{-6}$/° C., $100\times10^{-6}$/° C., $150\times10^{-6}$/° C., $200\times10^{-6}$/° C., $250\times10^{-6}$/° C., and $300\times10^{-6}$/° C.

For example, $CTE_4-CTE_3$, which is a difference obtainable by subtracting a third linear expansion coefficient $CTE_3$ of the substrate 20 from a fourth linear expansion coefficient $CTE_4$ of the substrate 20, is $1\times10^{-6}$/° C. or higher. The third linear expansion coefficient $CTE_3$ is an average value of linear expansion coefficient of the substrate 20 in the first direction in a temperature range of 25° C. to 80° C. The fourth linear expansion coefficient $CTE_4$ is an average value of linear expansion coefficient of the substrate 20 in the second direction in a temperature range of 25° C. to 80° C. When the difference $CTE_4-CTE_3$ is $1\times10^{-6}$/° C. or higher, the difference $\sigma_x-\sigma_y$ in the magnetic thin film 11 is easily adjusted to a desired value. Therefore, the magnetic properties of the magnetic thin film 11 are likely to have a large anisotropy in the second direction and in the first direction. The second direction corresponds, for example, to a machine direction (MD) of the substrate 20.

The difference $CTE_4-CTE_3$ may be $2\times10^{-6}$/° C. or more, may be $5\times10^{-6}$/° C. or more, may be $10\times10^{-6}$/° C. or more, may be $15\times10^{-6}$/° C. or more, may be $20\times10^{-6}$/° C. or more, may be $50\times10^{-6}$/° C. or more, or may be $100\times10^{-6}$/° C. or more. The difference $CTE_4-CTE_3$ is, for example, $500\times10^{-6}$/° C. or less.

The third linear expansion coefficient $CTE_3$ is not limited to a specific value. The third linear expansion coefficient $CTE_3$ is, for example, in a range of $0.1\times10^{-6}$° C. to $300\times10^{-6}$/° C. The third linear expansion coefficient $CTE_3$ may be, for example, in a range whose upper and lower limits are specified by a combination of any two values selected from the group consisting of $0.1\times10^{-6}$/° C., $1\times10^{-6}$/° C., $10\times10^{-6}$/° C., $20\times10^{-6}$/° C., $30\times10^{-6}$/° C., $40\times10^{-6}$/° C., $50\times10^{-6}$/° C., $60\times10^{-6}$/° C., $70\times10^{-6}$/° C., $80\times10^{-6}$/° C., $90\times10^{-6}$/° C., $100\times10^{-6}$, $150\times10^{-6}$/° C., $200\times10^{-6}$/° C., $250\times10^{-6}$/° C., and $300\times10^{-6}$/° C.

The fourth linear expansion coefficient $CTE_4$ is not limited to a specific value. The fourth linear expansion coefficient $CTE_4$ is, for example, in a range of $1\times10^{-6}$° C. to $300\times10^{-6}$/° C. The fourth linear expansion coefficient $CTE_4$ may be, for example, in a range whose upper and lower limits are specified by a combination of any two values selected from the group consisting of $1\times10^{-6}$/° C., $10\times10^{-6}$/° C., $20\times10^{-6}$/° C., $30\times10^{-6}$/° C., $40\times10^{-6}$/° C., $50\times10^{-6}$/° C., $60\times10^{-6}$/° C., $70\times10^{-6}$/° C., $80\times10^{-6}$/° C., $90\times10^{-6}$/° C., $100\times10^{-6}$, $150\times10^{-6}$/° C., $200\times10^{-6}$/° C., $250\times10^{-6}$/° C., and $300\times10^{-6}$/° C.

The tensile modulus of the substrate 20 is not limited to a specific value. The substrate 20 has, for example, a tensile modulus of 10 GPa or less. In this case, for example, the magnetic thin film 11 is formed while applying a tensile stress to the substrate 20 in the first direction (Y-axis direction) of the substrate 20, and then the tensile stress is relieved, so that the second internal stress $\sigma_x$ is likely to increase. As a result, the difference $\sigma_x-\sigma_y$ is easily adjusted to a desired value in the magnetic thin film 11. Therefore, the magnetic properties of the magnetic thin film 11 are likely to have a large anisotropy in the second direction and in the first direction.

The tensile modulus of the substrate 20 may be 8 GPa or less, may be 5 GPa or less, or may be 2 GPa or less. The substrate 20 can have, for example, such a tensile modulus in the direction in which tensile stress is applied to the substrate 20 when forming the magnetic thin film 11.

The glass transition temperature Tg of the substrate 20 is not limited to a specific value. The glass transition temperature Tg is, for example, 200° C. or lower. In this case, the substrate 20 can be easily stretched or shrunk in production of the magnetic-thin-film-equipped substrate 1*a*, and the difference $\sigma_x-\sigma_y$ in the magnetic thin film 11 is easily adjusted to a desired value.

The glass transition temperature Tg may be 150° C. or lower, may be 120° C. or lower, or may be 100° C. or lower. The glass transition temperature Tg is, for example, 25° C. or higher.

The material of the substrate 20 is not limited to any particular material. The substrate 20 includes, for example, an organic polymer. Examples of organic polymers include polyethylene terephthalate (PET), polyethylene naphthalate (PEN), acrylic resin (PMMA), polycarbonate (PC), polyimide (PI), and cyclo-olefin polymer (COP).

As shown in FIG. 1 and FIG. 2, a magnetic thermoelectric conversion element 100 including a magnetic-thin-film-equipped substrate 1*a* can be provided. In the magnetic thermoelectric conversion element 100, the magnetic thin film 11 includes a magnetic thermoelectric conversion body. This magnetic thermoelectric conversion body generates a thermoelectromotive force in a direction perpendicular to a heat flow. For example, when the heat flow is generated in the Z-axis direction, the electromotive force is generated in the Y-axis direction in the magnetic thin film 11.

As shown in FIG. 1 and FIG. 4, the magnetic thin film 11 forms, for example, fine wires 11*a*. The fine wires 11*a* extend, for example, in the first direction or in the second direction. The fine wires 11*a*, for example, extend in the first direction in the case where the magnetostriction constant of the magnetic thin film 11 is a positive value, and the fine wires 11*a* extend in the second direction in the case where the magnetostriction constant of the magnetic thin film 11 is a negative value.

The magnetic thermoelectric conversion body included in the magnetic thin film 11 generates an electromotive force by the magnetic thermoelectric effect. The magnetic thermoelectric effect is, for example, the anomalous Nernst effect or the spin Seebeck effect.

The magnetic thin film 11 includes, as a magnetic thermoelectric conversion body, a substance exhibiting, for example, the anomalous Nernst effect. The substance exhibiting the anomalous Nernst effect is not limited to a specific substance. The substance exhibiting the anomalous Nernst effect is, for example, a magnetic body having a saturation magnetic susceptibility of $5\times10^{-3}$ T or more or a material of a band structure having a Weil point in the vicinity of the Fermi energy. The magnetic body may be a ferrimagnetic body. The magnetic thin film 11 includes at least one substance selected from the group consisting of the following (i), (ii), (iii), (iv), and (v), for example, as a substance exhibiting the anomalous Nernst effect.

(i) A stoichiometric substance having a composition represented by $Fe_3X$ (ii) An off-stoichiometric substance in which the composition ratio of Fe to X is shifted from that of the substance in the (i)

(iii) A substance in which a part of the Fe site of the substance in the (i) or a part of the Fe site of the substance in the (ii) is substituted by a typical metal element or a transition element other than X (iv) A substance having a composition represented by $Fe_3M1_{1-x}M2_x$ ($0<x<1$), wherein M1 and M2 are typical elements different from each other (v) A substance in which a part of the Fe site of the substance in the (i) is substituted by a transition element other than X and a part of the X site of the substance in the (i) is substituted by a typical metal element other than X As to the substances of the (i) to the (v) above, X is a typical element or a transition element. The X is, for example, Al, Ga, Ge, Sn, Si, Ti, Zr, Hf, V, Nb, Ta, Cr, Mo, W, Sc, Ni, Mn, or Co. In the (iv), the combination of M1 and M2 is not limited to a specific combination as long as M1 and M2 are typical elements different from each other. In the (iv), the combination of M1 and M2 is, for example, Ga and Al, Si and Al, or Ga and B.

The magnetic thin film 11 may include $Co_2MnGa$ or $Mn_3Sn$ as a substance exhibiting the anomalous Nernst effect.

The magnetostriction constant λ of the magnetic thin film 11 is not limited to a specific value. The absolute value of the magnetostriction constant λ is, for example, $5\times10^{-6}$ or more. As mentioned above, the magnetic anisotropy energy $E_u$ of a magnetic body has the relation $E_u=(3/2)\lambda\sigma$. Therefore, when the absolute value of the magnetostriction constant λ is $5\times10^{-6}$ or more, the anisotropy of the magnetic properties of the magnetic thin film 11 in the second direction and in the first direction is likely to increase.

The absolute value of the magnetostriction constant λ may be $10\times10^{-6}$ or more, or may be $20\times10^{-6}$ or more.

The tensile modulus of the magnetic thin film 11 is not limited to a specific value. The tensile modulus is, for example, 50 GPa or more and 250 GPa or less. This makes it easy to adjust the difference $\sigma_x-\sigma_y$ of the magnetic thin film 11 to a desired value. The tensile modulus of the magnetic thin film 11 can be determined, for example, in accordance with the nanoindentation method.

The tensile modulus of the magnetic thin film 11 may be 70 GPa or more and 250 GPa or less, may be 100 GPa or more and 200 GPa or less, or may be 130 GPa or more and 150 GPa or less.

As shown in FIG. 1 and FIG. 2, the magnetic thermoelectric conversion element 100 further includes, for example, a wiring 12. The wiring 12 is electrically connected to the magnetic thin film 11. This allows the effect of the electromotive force, which is generated in the magnetic thin film 11 by the magnetic thermoelectric effect, to be exerted outside the magnetic thin film 11.

The wiring 12 may be formed of a single metal, or may be formed of an alloy.

The magnetic thin film 11 may include, for example, a plurality of fine wires 11*a*. The fine wires 11*a* extend in the first direction. The wiring 12 includes, for example, a plurality of wirings 12*a*. The fine wires 11*a* and the wirings 12*a* are electrically connected in series. With this configuration, a large output is easily obtained from the magnetic thermoelectric conversion element 100 even if the area of the surface on which the fine wires 11*a* and the wirings 12*a* are disposed is small.

As shown in FIG. 1, in the magnetic thermoelectric conversion element 100, a conductive path 15 is formed with the fine wires 11*a* and the wirings 12*a*. The fine wires 11*a* and the wirings 12*a* form, for example, a meander pattern. As a result, the length of the conductive path 15 is likely to increase, and the electromotive force generated in the magnetic-thin-film-equipped substrate 1*a* is likely to increase. For example, the electromotive force generated in the magnetic thermoelectric conversion element 100 can be taken out to the outside by connecting one end portion 15*p* and the other end portion 15*q* of the conductive path 15 to an external wiring. Alternatively, by applying a voltage between the one end portion 15*p* and the other end portion 15*q*, a heat flow can be generated in the thickness direction of the substrate 20.

As shown in FIG. 1, the fine wires 11*a* are disposed spaced apart at predetermined intervals in the X-axis direction, for example, and parallel to each other. The fine wires 11*a* are disposed at equal intervals in the X-axis direction. The wirings 12*a* electrically connect, for example, fine wires 11*a* adjacent to each other in the X-axis direction. The wiring 12*a* electrically connects, for example, one of the end portions in the Y-axis direction of a fine wire 11*a* to another end portion in the Y-axis direction of an adjacent fine wire 11*a*. The one end portions in the Y-axis direction of the thin wires 11*a* are located at the end on the same side in the Y-axis direction of the thin wires 11*a* while the other end portions in the Y-axis direction of the thin wires 11*a* are located at the end opposite in the Y-axis direction of the thin wires 11*a*.

The thickness of the fine wires 11*a* is not limited to a specific value. The fine wires 11*a* have a thickness of 1000 nm or less, for example. This makes it possible to reduce the amount of material used to form the magnetic thin film 11, and facilitates reducing the cost for manufacturing the magnetic-thin-film-equipped substrate 1*a*. In addition, disconnection of the conductive path 15 is unlikely to occur, where the conductive path 15 is formed with the fine wires 11*a* and the wirings 12*a* in the magnetic thermoelectric conversion element 100.

The thickness of the fine wires 11*a* may be 750 nm or less, may be 500 nm or less, may be 400 nm or less, may be 300 nm or less, or may be 200 nm or less. The thickness of the fine wire 11*a* is, for example, 5 nm or more. Thereby, the magnetic-thin-film-equipped substrate 1*a* can easily exhibit a high durability. The thickness of the fine wires 11*a* may be 10 nm or more, may be 20 nm or more, may be 30 nm or more, or may be 50 nm or more.

The width of the fine wires 11*a* is a dimension in the X-axis direction, and the width is not limited to a specific value. The width of the fine wires 11*a* is, for example, 500 μm or less. This makes it possible to reduce the amount of material used to form the magnetic thermoelectric conversion body in the magnetic thermoelectric conversion element 100, thereby facilitating reducing the cost for manufacturing the magnetic thermoelectric conversion element 100. In addition, a large number of fine wires 11*a* can be disposed easily in the X-axis direction, and thus, the electromotive force generated due to the magnetic thermoelectric conversion in the magnetic thermoelectric conversion element 100 is likely to increase.

The width of the fine wire 11*a* may be 400 μm or less, may be 300 μm or less, may be 200 μm or less, may be 100 μm or less, or may be 50 μm or less. The width of the fine wire 11*a* is, for example, 0.1 μm or more. As a result, disconnection in the conductive path 15 in the magnetic thermoelectric conversion element 100 are unlikely to occur, so that the magnetic thermoelectric conversion element 100 is more likely to exhibit a high durability. The width of the fine wire 11*a* may be 0.5 μm or more, may be 1 μm or more, may be 2 μm or more, may be 5 μm or more, may be 10 μm or more, may be 20 μm or more, or may be 30 μm or more.

The thickness of the wiring 12*a* is not limited to a specific value. The thickness of the wiring 12*a* is, for example, 1000 nm or less. This makes it possible to reduce the amount of material used to form the wiring 12, thereby facilitating reducing the cost for manufacturing the magnetothermoelectric conversion element 100. In addition, disconnection of the conductive path 15 in the magnetic thermoelectric conversion element 100 is unlikely to occur. The thickness of the wiring 12*a* may be 750 nm or less, may be 500 nm or less, may be 400 nm or less, may be 300 nm or less, may be 200 nm or less, or may be 100 nm or less.

The thickness of the wiring 12*a* is, for example, 5 nm or more. This allows the magnetic thermoelectric conversion element 100 to exhibit a high durability. The thickness of the wiring 12*a* may be 10 nm or more, may be 20 nm or more, may be 30 nm or more, or may be 50 nm or more.

The width of the wiring 12*a*, which is the dimension in the X-axis direction, is not limited to a specific value. For example, the width of the wirings 12*a* is 500 μm or less. This makes it possible to reduce the amount of material used to form the wiring 12 in the magnetic thermoelectric conversion element 100, thereby facilitating reducing the cost for manufacturing the magnetic thermoelectric conversion element 100. In addition, a large number of second wirings 12*a* can be disposed easily in the X-axis direction, and thus, the electromotive force generated due to the magnetic thermoelectric conversion in the magnetic thermoelectric conversion element 100 can be easily increased.

The width of the wiring 12*a* may be 400 μm or less, may be 300 μm or less, may be 200 μm or less, may be 100 μm or less, or may be 50 μm or less. The width of the wiring 12*a* is, for example, 0.1 μm or more. Thereby, disconnection of the conductive path 15 in the magnetic thermoelectric conversion element 100 is unlikely to occur, and the magnetic thermoelectric conversion element 100 is likely to exhibit a high durability. The width of the wiring 12*a* may be 0.5 μm or more, may be 1 μm or more, may be 2 μm or more, may be 5 μm or more, may be 10 μm or more, may be 20 μm or more, or may be 30 μm or more.

An example of a method for manufacturing a magnetic-thin-film-equipped substrate 1*a* is described below. The magnetic-thin-film-equipped substrate 1*a* is manufactured, for example, by a method including the following (I) and (II). In this method, for example, a difference obtainable by subtracting a first dimensional change rate from a second dimensional change rate is 0.10% or more. The first dimensional change rate is a value obtainable, in a test of heating the substrate 20 at 150° C. for 30 minutes, by dividing a dimension of the substrate 20 measured at 25° C. after the test by a dimension of the substrate 20 measured at 25° C. before the test, where both the dimensions are measured in a first direction (Y-axis direction) along the principal surface of the substrate 20. The second dimensional change rate is a value obtainable by dividing a dimension of the substrate 20 measured at 25° C. after the test by a dimension of the substrate 20 measured at 25° C. before the test, where both the dimensions are measured in a second direction (X-axis direction) parallel to the principal surface of the substrate 20 and perpendicular to the first direction. According to this manufacturing method, the degree of shrinkage of the substrate 20 after the heating in (ii) differs in the first direction and in the second direction, and the difference $\sigma_x-\sigma_y$ is easily adjusted to the desired range. In this manner, a magnetic-thin-film-equipped substrate 1*a* can be obtained in which the magnetic properties of the magnetic thin film 11 have a large anisotropy in the second direction and in the first direction.

(I) A magnetic thin film 11 is formed on one of the principal surfaces of the substrate 20.

(II) The substrate 20 and the magnetic thin film 11 are heated at a predetermined temperature.

In the aforementioned method, the difference obtainable by subtracting the first dimensional change rate from the second dimensional change rate may be, for example, 0.2% or more, may be 0.3% or more, may be 0.4% or more, or may be 0.5% or more. The difference may be 10% or less.

In the (I), a magnetic thin film 11 is formed on one principal surface of the substrate 20 by a method such as sputtering, chemical vapor deposition (CVD), pulsed laser deposition (PLD), ion plating, or plating. Next, a photoresist is applied on the thin film, for example, and a photomask is placed over the thin film and exposed to light, followed by wet etching. In this manner, a plurality of linear patterns of the magnetic thin film 11 disposed at predetermined intervals is formed. Next, a thin film of a precursor of the wiring 12 is formed on one principal surface of the substrate 20 by a method such as sputtering, CVD, PLD, ion plating, or plating. Next, a photoresist is applied on the thin film of the precursor of the wiring 12, a photomask is placed over the thin film of the precursor of the wiring 12, and exposed to light, followed by wet etching. A wiring 12 is obtained in this manner, and the linear patterns of the magnetic thin film 11 are electrically connected to each other.

The temperature for the heating in (II) is not limited to a specific temperature. The ambient temperature of the substrate 20 and the magnetic thin film 11 during the heating is, for example, 50° C. or higher. This facilitates adjustment of the difference $\sigma_x - \sigma_y$ to a desired range in the magnetic thin film 11. The ambient temperature of the substrate 20 and the magnetic thin film 11 during the heating may be 100° C. or higher, may be 150° C. or higher, or may be 200° C. or higher. The ambient temperature is, for example, 300° C. or lower.

There is no specific limitation on the period of time for which the ambient temperature of the magnetic thin film 11 is kept at 50° C. or higher during the heating. The time is, for example, 10 minutes or more and 3 hours or less.

After the heating, the magnetic thin film 11 is magnetized. In this manner, the magnetic thermoelectric conversion element 100 is obtained.

The magnetic thermoelectric conversion element 100 may be provided with, for example, an adhesive layer. In this case, the substrate 20 is disposed between the magnetic thin film 11 and the adhesive layer in the thickness direction of the substrate 20. Thereby, the magnetic thermoelectric conversion element 100 can be attached to an article by pressing the adhesive layer against the article.

The adhesive layer includes, for example, a rubber-based adhesive, an acrylic-based adhesive, a silicone-based adhesive, or a urethane-based adhesive. The magnetic thermoelectric element 100 may be provided with an adhesive layer and a release liner. In this case, the release liner covers the adhesive layer. The release liner is typically a film that can maintain the adhesive force of the adhesive layer while covering the adhesive layer, and can be easily removed from the adhesive layer. The release liner is, for example, a film made of polyester resin such as PET. By peeling off the release liner, the adhesive layer is exposed and the magnetic thermoelectric conversion element 100 can be stuck to an article.

Figure 5:
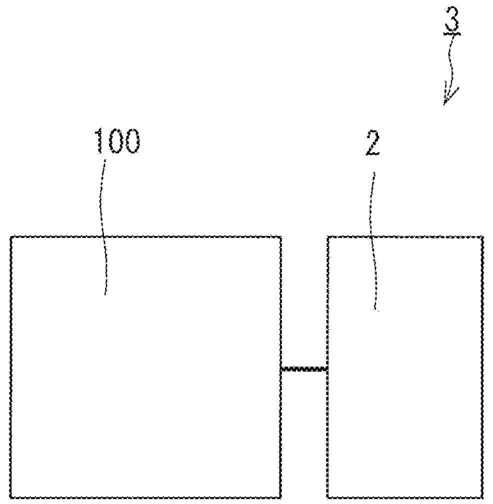
FIG. 5 shows an example of an embodiment of a sensor.

As shown in FIG. 5, for example, a sensor 3 including the magnetic thermoelectric conversion element 100 can be provided. As to this sensor 3, for example, when a temperature gradient occurs in the thickness direction of the substrate 20, an electromotive force is generated in the first direction of the magnetic thin film 11 due to the magnetic thermoelectric effect. The sensor 3 is capable of sensing heat by processing the electrical signal output outside the magnetic thermoelectric element 100 based on this electromotive force. The sensor 3 further includes, for example, a signal processor 2. In the signal processor 2, the electrical signal output outside the magnetic thermoelectric conversion element 100 is processed.

The magnetic thermoelectric conversion element 100 can be modified from various viewpoints. The magnetic thermoelectric conversion element 100 may be modified, for example, as the thermoelectric conversion element 1*b* shown in FIG. 6. The thermoelectric conversion element 1*b* is configured in the same manner as the magnetic thermoelectric conversion element 100, except for the portions to be described in particular. Components of the thermoelectric conversion element 1*b*, which are identical or correspond to the components of the magnetic thermoelectric conversion element 100, are marked with signs identical to those of the magnetic thermoelectric conversion element 100, and detailed descriptions therefor are omitted. The description of the magnetic thermoelectric conversion element 100 also applies to the thermoelectric conversion element 1*b* as long as it is not technically contradictory.

Figure 6:
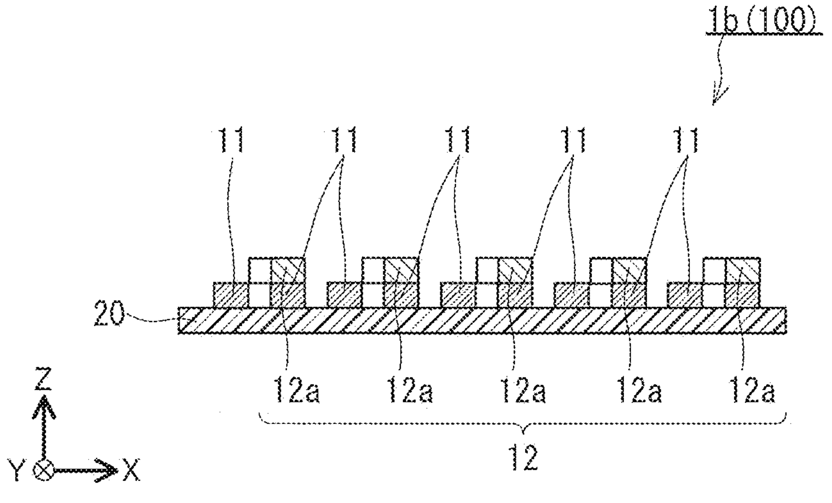
FIG. 6 shows another example of an embodiment of a magnetic-thin-film-equipped substrate.

As shown in FIG. 6, in the thermoelectric conversion element 1*b*, the magnetic thin film 11 extends continuously on the same plane, for example. The wiring 12 is disposed over a portion of the magnetic thin film 11. For example, the wirings 12*a* included in the wiring 12 are disposed spaced apart at predetermined intervals on the magnetic thin film 11.

In the thermoelectric conversion element 1*b*, the magnetic thin film 11 forms, for example, a meander pattern. The thermoelectric conversion element 1*b* is configured so that, in a plan view, a single layer of the magnetic thin film 11 and a laminate including the magnetic thin film 11 and the wirings 12*a* will appear alternately in the second direction.

EXAMPLES

Hereinafter, the present invention will be described in detail by referring to Examples. It should be noted that the present invention is not limited to the following Examples. First, evaluation methods regarding Examples and Comparative Examples will be explained.

[Measurement of Internal Stress]

By using an X-ray diffractometer Smartlab manufactured by Rigaku Corporation, a sample was irradiated with a Cu-Kα ray from a light source of 40 kV and 50 mA through a parallel beam optical system, thereby evaluating a first internal stress $\sigma_y$ and a second internal stress $\sigma_x$ in the magnetic body in each Example and each Comparative Example in accordance with the principle of a gradient measurement method according to a $\sin^2 \Psi$ method. The Cu-Kα ray had a wavelength λ of 0.1541 nm. The $\sin^2 \Psi$ method is a method for determining the internal stress in a polycrystalline thin film from the dependence of the crystal lattice strain with respect to the angle (Ψ) of the thin film. Using the aforementioned X-ray diffractometer, a diffraction intensity was measured every 0.01° in the range of 2θ=75° to 85° through a θ/2θ scan measurement. The integration time at each measurement point was set to 100 seconds. The crystal lattice spacing d of the magnetic body at each measurement angle (Ψ) was calculated from the peak angle 2θ of the obtained X-ray diffraction and the wavelength λ of the X-ray irradiated from a light source, and the crystal lattice strain ε was calculated from the crystal lattice spacing d, based on the relation between the following Equations (1) and (2). The λ is the wavelength of X-ray (Cu-Kα ray)

emitted from the light source, and $\lambda$=0.1541 nm. Here, $d_0$ is the lattice spacing of the magnetic body in a stress-free state, and $d_0$=0.0206 nm.

$$2d\sin\theta=\lambda \quad \text{Equation (1)}$$

$$\varepsilon=(d-d_0)/d_0 \quad \text{Equation (2)}$$

Figure 7:
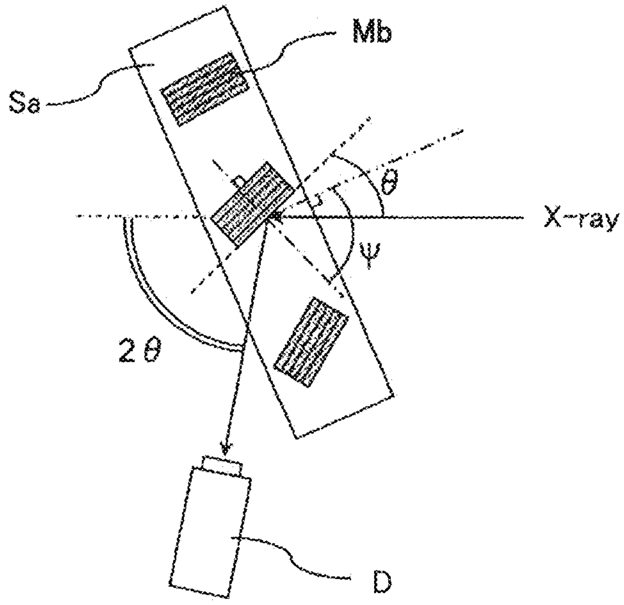
FIG. 7 schematically shows a method for measuring an internal stress in a magnetic-thin-film-equipped substrate.

As shown in FIG. 7, the aforementioned X-ray diffraction measurement was performed for each case where the angle ($\Psi$) between the normal to the principal surface of a magnetic body sample Sa and the normal to a crystal plane of a magnetic body Mb was 0°, 17°, 24°, 30°, 35°, 40°, or 45°, thereby calculating the crystal lattice strain $\varepsilon$ at each angle ($\Psi$). Thereafter, $\sigma_y$ and $\sigma_x$ were calculated from a slope of a straight line plotting the relation between $\sin^2\Psi$ and a crystal lattice strain $\varepsilon$, from Equation (3) below. Here, $\sigma_y$ refers to a first internal stress of the magnetic body in the length direction of a plurality of thin wire portions of the magnetic body parallel to each other and extending in the length direction of the Cu thin wire, and $\sigma_x$ refers to a second internal stress of the magnetic body in a direction perpendicular to the length direction. The results are shown in Table 2. As to the internal stress in Table 2, a positive value indicates a tensile stress and a negative value indicates a compressive stress. In a side inclination method, the stress in the direction of 90° to the beam direction is measured, therefore, when determining the first internal stress $\sigma_y$ and the second internal stress $\sigma_x$, the sample was placed so that the direction for measurement would be perpendicular to the beam direction.

$$\varepsilon=\{(1+v)/E\}\sigma\sin^2\Psi-(2v/E)\sigma \quad \text{Equation (3)}$$

In the Equation (3), E is a Young's modulus (130 GPa) of the magnetic body, and v is a Poisson's ratio (0.3) of the magnetic body. In the figure, a detector D detects an X-ray diffraction.

[Thermo-Mechanical Analysis of Substrate]

A thermo-mechanical analysis (TMA) was performed on samples prepared from the substrates used in each of Examples and Comparative Examples so as to measure a linear expansion coefficient of $CTE_1$ in the length direction of the FeGa-containing linear pattern (first direction), a linear expansion coefficient of $CTE_2$ in the width direction of the FeGa-containing linear pattern (second direction), and the glass transition temperature Tg of the substrate. The linear expansion coefficients $CTE_1$ and $CTE_2$ each is the average value of the linear expansion coefficient of the substrate at a temperature in the range of 80° C. to 150° C. A thermo-mechanical analyzer TMA450 manufactured by TA Instruments was used for the measurement. The results are shown in Table 1.

[Tensile Modulus of Substrate]

The tensile modulus $E_{TD}$ in the transverse direction (TD) and the tensile modulus $E_{MD}$ in the mechanical direction (MD) of the substrate were measured in accordance with the Japanese Industrial Standard (JIS) K7161-1 using specimens made from the substrate used in each of Examples and Comparative Examples. For this measurement, a test machine TCM-1 kNB manufactured by Minebea Mitsumi Inc., was used. The test speed was set at 300 mm/min. The results are shown in Table 1.

[Dimensional Change Rate of Substrate]

Figure 8A:
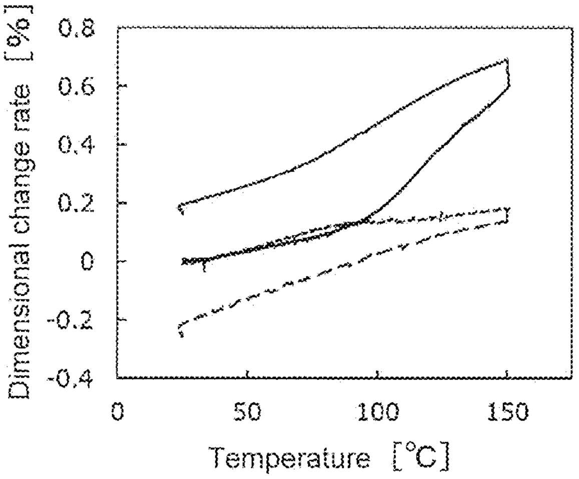
FIG. 8A is a graph showing a relation between a dimensional change rate of a substrate used in Example 1 and temperature.
Figure 8B:
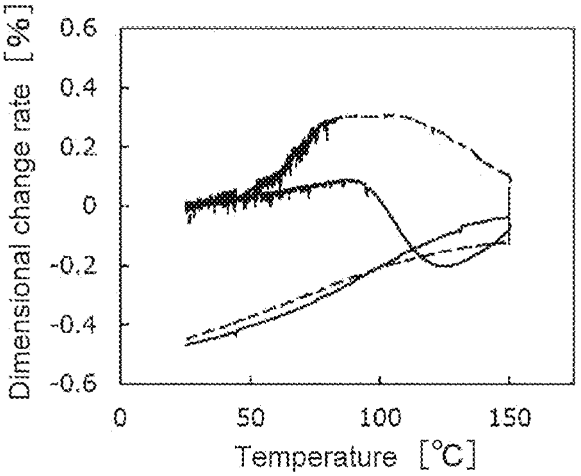
FIG. 8B is a graph showing a relation between a dimensional change rate of a substrate used in Comparative Example 3 and temperature.

A heating test was performed, in which specimens made from the substrates used in Examples and Comparative Examples were heated at 150° C. for 30 minutes. A value obtainable by dividing a dimension of the substrate in the length direction (first direction) of the FeGa-containing linear pattern measured at 25° C. after the heating test by a dimension of the substrate measured at 25° C. before the heating test was determined as a first dimensional change rate. A value obtainable by dividing a dimension of the substrate in the width direction (second direction) of the FeGa-containing linear pattern measured at 25° C. after the heating test by a dimension of the substrate measured at 25° C. before the heating test was determined as a second dimensional change rate. Furthermore, a difference was obtained by subtracting the first dimensional change rate from the second dimensional change rate. FIG. 8A is a graph showing a relation between the dimensional change rate of the substrate used in Example 1 and temperature. FIG. 8B is a graph showing a relation between the dimensional change rate of the substrate used in Comparative Example 3 and temperature. Table 1 shows the results regarding the dimensional change rate of the substrate under the heating conditions in each Example and each Comparative Example.

[Tensile Modulus of Magnetic Body]

The tensile modulus of the magnetic body in each Example and each Comparative Example was measured according to the nanoindentation method using a nanoindenter TriboIndenter (TI-950) manufactured by Hysitron, Inc. In the measurement, a diamond triangular pyramidal Berkowitsch indenter was pressed into the sample. The diagonal angle of the indenter was 115°.

[Magnetic Properties]

The magnetic properties of the magnetic body of the thermoelectric conversion element for each Example and each Comparative Example were measured using a Physical Property Measurement System PPMS-versalab supplied from Quantum Design Inc. For this measurement, measurement samples made by cutting the thermoelectric conversion element for each Example and each Comparative Example into 2 mm squares were used. In addition, a Vibration Sample Magnetrometer (VSM) was used in the measurement to sweep a magnetic field of ±800 [kA/m] in the length direction (first direction) of the FeGa-containing linear pattern and in the width direction (second direction) of the FeGa-containing linear pattern at a temperature of 300 K, so that the M-H curves of a first axis along the first direction and a second axis along the second direction of the magnetic body were obtained by considering the thickness of the magnetic body and the area of the magnetic body in the measurement sample. By calculating the integral value of the M-H curve for the first axis and the integral value of the M-H curve for the second axis in the region of the obtained M-H curve swept from 800 to 0 [kA/m], energy in the in-plane direction of each axis was calculated, and the magnetic anisotropy constant $K_u$ in the in-plane direction was determined by taking the difference between them. A ratio of the magnetization at 0 kA/m to the magnetization at 800 kA/m in the obtained M-H curve was calculated with the squareness ratio. The results are shown in Table 2.

The magnetostriction constant $\lambda$ of the magnetic body of the thermoelectric conversion element in each Example and each Comparative Example was obtained by considering the relation $K_u=(3/2)\lambda\sigma$ regarding the inverse magnetostriction effect. The magnetostriction constant is a value determined by dividing a gradient of an approximate curve by 3/2, where the approximate curve is obtained by plotting a relation between the magnetic anisotropy constant $K_u$ and the difference $\sigma_x-\sigma_y$ obtained by subtracting the first internal stress $\sigma_y$ from the second internal stress $\sigma_x$. The results are shown in Table 2.

[Evaluation on Crack Resistance with Regard to Bending]

Strip-shaped specimens were prepared from the thermoelectric conversion elements according to Examples and Comparative Examples. Each specimen was wrapped around a horizontally-fixed cylindrical mandrel having a diameter of 10 mm, and a 100 g weight was attached to the both ends of the specimen, thereby applying a load to the specimen. The specimen was wound around the mandrel so that the length direction of the Cu fine wire was parallel to the mandrel. Afterwards, the specimen was checked to see if any disconnection had occurred. It was determined that a disconnection in the meander pattern occurred when the electrical resistance value of the meander pattern became 1.5 times or more its initial value. The results are shown in Table 3. In Table 3, "A" means that no disconnection was observed, and "X" means that disconnection was observed.

[Thermoelectric Conversion Properties]

The thermoelectric conversion properties of the thermoelectric conversion element for each Example and each Comparison Example were measured using a thermal conductivity measuring device TCM1001 manufactured by RHESCA CO., LTD. A thermal conductive rod made of SUS303 was used for the measurement, and the heat flow applied to the measurement system was quantified using the one-way heat flow steady-state method. The thermoelectric conversion element was fixed between the rod on the heating side and a rod on the cooling side, using a silicone grease KS609 manufactured by Shin-Etsu Chemical Co. The heating temperature of the heater was set at 100° C., and the chiller for cooling was set at 20° C. The heat flow through the system was adjusted to 1.5 $W/cm^2$. The electromotive force of the thermoelectric conversion element at the time the heat flow was stabilized was read using a digital multimeter Keithley 2100 manufactured by TEKTRONIX INC. The measurement was performed in external magnetic fields of 0 T and 0.1 T, and the output stability of the thermoelectric conversion element in the zero magnetic field was evaluated by its ratio. The results are shown in Table 3.

Example 1

A magnetic thin film having a thickness of 96 nm was formed on a polyethylene terephthalate (PET) film (PET-A) having a thickness of 50 μm by DC magnetron sputtering using a target material containing Fe and Ga. In this target material, the atomic number ratio of Fe content:Ga content=3:1. In the DC magnetron sputtering, an argon gas was supplied as the process gas at a pressure of 0.1 Pa. The temperature of the PET film was adjusted to 25° C. The PET film on which the magnetic thin film was formed was heated at an ambient temperature of 150° C. for 30 minutes. Next, a photoresist was applied on the magnetic thin film, a photomask was disposed on the magnetic thin film and exposed to light, followed by wet etching. As a result, a plurality of FeGa-containing linear patterns arranged at predetermined intervals were formed. The width of each FeGa-containing linear pattern was 100 μm, and the length of each FeGa-containing linear pattern was 1.5 cm. Later, a Cu thin film having a thickness of 100 nm was formed by DC magnetron sputtering using a Cu-containing target material. A photoresist was applied on the Cu thin film, then, a photomask was disposed on the Cu thin film and exposed to light, followed by wet etching. As a result, a Cu-containing linear pattern with a width of 40 μm was formed. Each pair of adjacent FeGa-containing linear patterns were electrically connected by the Cu-containing linear pattern, thereby forming 95 pairs of conductive paths of a meander pattern. An electromagnet with a central magnetic flux density of 0.5 T was used to magnetize the FeGa-containing linear pattern in the width direction parallel to the principal surface of the PET film and perpendicular to the length direction of the FeGa-containing linear pattern. In this manner, the thermoelectric conversion element according to Example 1 was produced. In this thermoelectric conversion element, the transverse direction (TD) of the PET film coincided with the width direction of the FeGa-containing linear pattern.

Example 2

A thermoelectric conversion element according to Example 2 was produced in the same manner as in Example 1, except that the ambient temperature during the heating of the PET film with the magnetic thin film formed thereon was changed to 200° C.

Example 3

A thermoelectric conversion element according to Example 3 was produced in the same manner as in Example 1 except for the following points. The temperature of the PET film during the DC magnetron sputtering was changed to 130° C. The heating for 30 minutes was not performed after the formation of the magnetic thin film. The machine direction (MD) of the PET film coincided with the width direction of the FeGa-containing linear pattern.

Example 4

A thermoelectric conversion element according to Example 4 was produced in the same manner as in Example 1 except for the following points. The temperature of the PET film during the DC magnetron sputtering was changed to 100° C. The ambient temperature during the heating of the PET film with the magnetic thin film formed thereon was adjusted to 100° C.

Example 5

A thermoelectric conversion element according to Example 5 was produced in the same manner as in Example 4, except that the ambient temperature during the heating of the PET film with the magnetic thin film formed thereon was changed to 125° C.

Example 6

A thermoelectric conversion element according to Example 6 was produced in the same manner as in Example 4, except that the ambient temperature during the heating of the PET film with the magnetic thin film formed thereon was changed to 150° C.

Example 7

A thermoelectric conversion element according to Example 7 was produced in the same manner as in Example 4, except that the ambient temperature during the heating of the PET film with the magnetic thin film formed thereon was changed to 200° C.

Example 8

A thermoelectric conversion element according to Example 8 was produced in the same manner as in Example 1, except that the temperature of the PET film during the DC magnetron sputtering was changed to 130° C., and an argon gas was supplied as the process gas at a pressure of 1.0 Pa.

Comparative Example 1

A thermoelectric conversion element according to Comparative Example 1 was produced in the same manner as in Example 1, except that a glass sheet having a thickness of 0.7 mm was used in place of the PET film.

Comparative Example 2

A thermoelectric conversion element according to Comparative Example 2 was produced in the same manner as in Example 1, except that the ambient temperature during the heating of the PET film with the magnetic thin film formed thereon was changed to 50° C.

Comparative Example 3

A thermoelectric conversion element according to Comparative Example 3 was produced in the same manner as in Example 1, except that a PET film (PET-B) having a thickness of 125 μm was used in place of the PET-A used in Example 1.

As shown in Tables 1 and 2, a difference $\sigma_x-\sigma_y$ obtainable by subtracting a first internal stress $\sigma_y$ of a magnetic body of a thermoelectric conversion element according to each Example from a second internal stress $\sigma_x$, was 50 MPa or more. On the other hand, differences $\sigma_x-\sigma_y$ of the magnetic bodies of the thermoelectric conversion elements according to Comparative Examples 1, 2, and 3, were 20 MPa, −31 MPa, and 39 MPa, respectively. It is understood that the magnetic thin film of the thermoelectric conversion element according to each Example has a large magnetic anisotropy, and thus, an easy axis in the magnetic thin film is likely to occur in the width direction. On the other hand, any of the magnetic thin films of the thermoelectric conversion elements in Comparative Examples do not have a large magnetic anisotropy, and considering a shape magnetic anisotropy, it is understood that a difficult axis is likely to occur in the width direction of the magnetic thin film.

For the thermoelectric conversion element according to any of Examples, the ratio of the electromotive force at a magnetic field of 0 T (zero magnetic field) to the electromotive force at a magnetic field of 0.1 T was 0.8 or more. This suggests that a large thermoelectromotive force can be obtained under the zero magnetic field due to a large magnetic anisotropy. On the other hand, for the thermoelectric conversion element according to any of Comparative Examples, the ratio of an electromotive force at a magnetic field of 0 T (zero magnetic field) to an electromotive force at a magnetic field of 0.1 T was small, and the decreasing rate in the electromotive force under a zero magnetic field was large. For the thermoelectric conversion elements according to Comparative Examples, it is considered that the magnetic thin film does not have a large magnetic anisotropy, and thus, the width direction of the fine wire is likely to become an axis of hard magnetization, and the thermoelectromotive force under a zero magnetic field is lowered.

TABLE 1

| | Substrate | | | |
|---|---|---|---|---|
| | | Linear expansion coefficient [×10$^{-6}$/° C.] | | |
| | Material | $CTE_2$ | $CTE_1$ | $\lvert CTE_2 - CTE_1\rvert$ |
| Example 1 | PET-A | 30 | 143 | 113 |
| Example 2 | PET-A | 30 | 143 | 113 |
| Example 3 | PET-A | 143 | 30 | 113 |
| Example 4 | PET-A | 30 | 143 | 113 |
| Example 5 | PET-A | 30 | 143 | 113 |
| Example 6 | PET-A | 30 | 143 | 113 |
| Example 7 | PET-A | 30 | 143 | 113 |
| Example 8 | PET-A | 30 | 143 | 113 |
| Comparative Example 1 | Glass | — | — | — |
| Comparative Example 2 | PET-A | 30 | 143 | 113 |
| Comparative Example 3 | PET-B | 53 | 7 | 46 |

| | Substrate | | | | |
|---|---|---|---|---|---|
| | Young's modulus [GPa] | $T_g$ [° C.] | Dimensional change rate after heating [%] Second direction | First direction | Difference |
| Example 1 | 4.2 | 80 | 0.15 | −0.27 | 0.42 |
| Example 2 | 4.2 | 80 | −0.13 | −0.79 | 0.66 |
| Example 3 | 4.2 | 80 | — | — | — |
| Example 4 | 4.2 | 80 | 0.03 | −0.18 | 0.21 |
| Example 5 | 4.2 | 80 | 0.09 | −0.23 | 0.32 |
| Example 6 | 4.2 | 80 | 0.15 | −0.27 | 0.42 |
| Example 7 | 4.2 | 80 | −0.13 | −0.79 | 0.66 |
| Example 8 | 4.2 | 80 | 0.08 | −0.27 | 0.35 |
| Comparative Example 1 | 73 | — | 0 | 0 | 0 |
| Comparative Example 2 | 4.2 | 80 | 0.02 | 0.02 | 0 |
| Comparative Example 3 | 4.1 | 82 | −0.48 | −0.45 | 0.03 |

TABLE 2

| | Magnetic body | | | |
|---|---|---|---|---|
| | | Internal stress [MPa] | | Stress difference |
| | Material | $\sigma_x$ | $\sigma_y$ | $\sigma_x - \sigma_y$ [MPa] |
| Example 1 | $Fe_3Ga$ | 151 | 65 | 86 |
| Example 2 | $Fe_3Ga$ | 25 | −112 | 137 |
| Example 3 | $Fe_3Ga$ | −75 | −296 | 221 |
| Example 4 | $Fe_3Ga$ | −183 | −398 | 215 |
| Example 5 | $Fe_3Ga$ | −312 | −530 | 218 |
| Example 6 | $Fe_3Ga$ | −402 | −658 | 256 |
| Example 7 | $Fe_3Ga$ | −575 | −902 | 327 |

TABLE 2-continued

| | | | | |
|---|---|---|---|---|
| Example 8 | FesGa | 473 | 226 | 247 |
| Comparative Example 1 | $Fe_3Ga$ | 230 | 210 | 20 |
| Comparative Example 2 | $Fe_3Ga$ | 559 | 590 | −31 |
| Comparative Example 3 | $Fe_3Ga$ | −1060 | −1021 | −39 |

| | Magnetic body | | | | |
|---|---|---|---|---|---|
| | | Young's | Magnetic | Squareness ratio | |
| | Magnetostriction constant λ [×10$^{-6}$] | modulus [GPa] | anisotropy constant [kJ/m$^3$] | Second direction | First direction |
| Example 1 | 52 | 130 | 8.1 | 0.88 | 0.37 |
| Example 2 | 52 | 130 | 12.1 | 0.89 | 0.22 |
| Example 3 | 52 | 130 | 3.2 | 0.89 | 0.53 |
| Example 4 | 52 | 130 | 2.7 | 0.82 | 0.53 |
| Example 5 | 52 | 130 | 3.0 | 0.83 | 0.51 |
| Example 6 | 52 | 130 | 6.1 | 0.86 | 0.35 |
| Example 7 | 52 | 130 | 12.4 | 0.92 | 0.23 |
| Example 8 | 52 | 130 | 5.4 | 0.91 | 0.42 |
| Comparative Example 1 | 52 | 130 | −1.1 | 0.78 | 0.69 |
| Comparative Example 2 | 52 | 130 | −0.5 | 0.79 | 0.80 |
| Comparative Example 3 | 52 | 130 | 0.7 | 0.79 | 0.77 |

TABLE 3

| | Thermoelectric conversion element | | | |
|---|---|---|---|---|
| | | Thermoelectromotive force [μV] | | Electromotive |
| | Crack resistance | Electromotive force at 0.1 T $V_{0.1\ T}$ | Electromotive force at 0 T $V_{0\ T}$ | force ratio $V_{0\ T}/V_{0.1\ T}$ |
| Example 1 | A | 4442 | 3909 | 0.88 |
| Example 2 | A | 4241 | 3774 | 0.89 |
| Example 3 | A | 4203 | 3741 | 0.89 |
| Example 4 | A | 4668 | 3842 | 0.82 |
| Example 5 | A | 4896 | 4044 | 0.83 |
| Example 6 | A | 3929 | 3370 | 0.86 |
| Example 7 | X | 3802 | 3505 | 0.92 |
| Example 8 | A | 3444 | 3134 | 0.91 |
| Comparative Example1 | X | 3567 | 2797 | 0.78 |
| Comparative Example 2 | A | 3838 | 3033 | 0.79 |
| Comparative Example 3 | X | 3882 | 3067 | 0.79 |

A first aspect of the present invention provides a magnetic-thin-film-equipped substrate, including:

a substrate; and a magnetic thin film disposed on the substrate, wherein a difference obtainable by subtracting a first internal stress of the magnetic thin film from a second internal stress of the magnetic thin film is 50 MPa or more, the first internal stress is an internal stress of the magnetic thin film in a first direction along a surface of the magnetic thin film extending in parallel with the substrate, and the second internal stress is an internal stress of the magnetic thin film in a second direction parallel to the surface and perpendicular to the first direction.

A second aspect of the present invention provides the magnetic-thin-film-equipped substrate according to the first aspect, wherein the second internal stress is 900 MPa or less.

A third aspect of the present invention provides the magnetic-thin-film-equipped substrate according to the first or second aspect, wherein the first internal stress is −900 MPa or more.

A fourth aspect of the present invention provides the magnetic-thin-film-equipped substrate according to any one of the first to third aspects, wherein the magnetic thin film satisfies any one of the following requirements (a) and (b):

(a) a squareness ratio determined by a M-H curve in the first direction is 0.7 or less; and (b) a squareness ratio determined by a M-H curve in the second direction is 0.7 or less.

A fifth aspect of the present invention provides the magnetic-thin-film-equipped substrate according to any one of the first to fourth aspects, wherein the substrate has flexibility.

A sixth aspect of the present invention provides the magnetic-thin-film-equipped substrate according to any one of the first to fourth aspects, wherein the magnetic thin film has a thickness of 5 to 1000 nm.

A seventh aspect of the present invention provides the magnetic-thin-film-equipped substrate according to any one of the first to sixth aspects, wherein an absolute value of a difference between a second linear expansion coefficient of the substrate and a first linear expansion coefficient of the substrate is $20\times10^{-6}$/° C. or more, the first linear expansion coefficient is an average value of linear expansion coefficients of the substrate in the first direction in a range from a temperature higher by 5° C. than a glass transition temperature of the substrate to a temperature higher by 55° C. than the glass transition temperature, and the second linear expansion coefficient is an average value of linear expansion coefficients of the substrate in the second direction in the range.

An eighth aspect of the present invention provides the magnetic-thin-film-equipped substrate according to any one of the first to seventh aspects, wherein the substrate has a tensile modulus of 10 GPa or less.

A ninth aspect of the present invention provides the magnetic-thin-film-equipped substrate according to any one of the first to eighth aspects, wherein the substrate has a glass transition temperature of 200° C. or lower.

A tenth aspect of the present invention provides the magnetic-thin-film-equipped substrate according to any one of the first to ninth aspects, wherein an absolute value of a magnetostriction constant of the magnetic thin film is $5\times10^{-6}$ or more.

An eleventh aspect of the present invention provides the magnetic-thin-film-equipped substrate according to any one of the first to tenth aspects, wherein the magnetic thin film has a tensile modulus of 50 GPa or more and 250 GPa or less.

A twelfth aspect of the present invention provides a magnetic thermoelectric conversion element including the magnetic-thin-film-equipped substrate according to any one of the first to eleventh aspects, wherein the magnetic thin film includes a magnetic thermoelectric conversion body capable of generating a thermoelectromotive force in a direction perpendicular to a heat flow.

A thirteenth aspect of the present invention provides the magnetic thermoelectric conversion element according to the twelfth aspect, wherein the magnetic thin film forms a thin wire extending in the first direction or in the second direction.

A fourteenth aspect of the present invention provides the magnetic thermoelectric conversion element according to the twelfth or thirteenth aspect, further including a wiring electrically connected to the magnetic thin film.

A fifteenth aspect of the present invention provides the magnetic thermoelectric conversion element according to the fourteenth aspect, wherein the magnetic thin film forms a plurality of thin wires extending in the first direction or in the second direction, the wiring includes a plurality of wirings, and the thin wires and the wirings are electrically connected in series.

A sixteenth aspect of the present invention provides a sensor including the thermoelectric conversion element according to any one of the twelfth to fifteenth aspects.

A seventeenth aspect of the present invention provides a method for manufacturing a magnetic-thin-film-equipped substrate, the method including:

forming a magnetic thin film on one principal surface of a substrate; and heating the substrate and the magnetic thin film at a predetermined temperature, wherein a difference obtainable by subtracting a first dimensional change rate from a second dimensional change rate is 0.10% or more, the first dimensional change rate is a value obtainable, in a test of heating the substrate at 150° C. for 30 minutes, by dividing a dimension of the substrate measured at 25° C. after the test by a dimension of the substrate measured at 25° C. before the test, where both the dimensions are measured in a first direction along the principal surface of the substrate, and the second dimensional change rate is a value obtainable by dividing a dimension of the substrate measured at 25° C. after the test by a dimension of the substrate measured at 25° C. before the test, where both the dimensions are measured in a second direction parallel to the principal surface of the substrate and perpendicular to the first direction.

The invention claimed is:

1. A magnetic-thin-film-equipped substrate, comprising:

a substrate; and a magnetic thin film disposed on the substrate, wherein a difference obtainable by subtracting a first internal stress of the magnetic thin film from a second internal stress of the magnetic thin film is 50 MPa or more, the first internal stress is an internal stress of the magnetic thin film in a first direction along a surface of the magnetic thin film extending in parallel with the substrate, and the second internal stress is an internal stress of the magnetic thin film in a second direction parallel to the surface and perpendicular to the first direction.

2. The magnetic-thin-film-equipped substrate according to claim 1, wherein the second internal stress is 900 MPa or less.

3. The magnetic-thin-film-equipped substrate according to claim 1, wherein the first internal stress is −900 MPa or more.

4. The magnetic-thin-film-equipped substrate according to claim 1, wherein the magnetic thin film satisfies any one of the following requirements (a) and (b):

(a) a squareness ratio determined by a M-H curve in the first direction is 0.7 or less; and (b) a squareness ratio determined by a M-H curve in the second direction is 0.7 or less.

5. The magnetic-thin-film-equipped substrate according to claim 1, wherein the substrate has flexibility.

6. The magnetic-thin-film-equipped substrate according to claim 1, wherein the magnetic thin film has a thickness of 5 to 1000 nm.

7. The magnetic-thin-film-equipped substrate according to claim 1, wherein an absolute value of a difference between a second linear expansion coefficient of the substrate and a first linear expansion coefficient of the substrate is $20\times10^{-6}$/° C. or more, the first linear expansion coefficient is an average value of linear expansion coefficients of the substrate in the first direction in a range from a temperature higher by 5° C. than a glass transition temperature of the substrate to a temperature higher by 55° C. than the glass transition temperature, and the second linear expansion coefficient is an average value of linear expansion coefficients of the substrate in the second direction in the range.

8. The magnetic-thin-film-equipped substrate according to claim 1, wherein the substrate has a tensile modulus of 10 GPa or less.

9. The magnetic-thin-film-equipped substrate according to claim 1, wherein the substrate has a glass transition temperature of 200° C. or lower.

10. The magnetic-thin-film-equipped substrate according to claim 1, wherein an absolute value of a magnetostriction constant of the magnetic thin film is $5\times10^{-6}$ or more.

11. The magnetic-thin-film-equipped substrate according to claim 1, wherein the magnetic thin film has a tensile modulus of 50 GPa or more and 250 GPa or less.

12. A magnetic thermoelectric conversion element comprising the magnetic-thin-film-equipped substrate according to claim 1, wherein the magnetic thin film includes a magnetic thermoelectric conversion body capable of generating a thermoelectromotive force in a direction perpendicular to a heat flow.

13. The magnetic thermoelectric conversion element according to claim 12, wherein the magnetic thin film forms a thin wire extending in the first direction or in the second direction.

14. The magnetic thermoelectric conversion element according to claim 12, further comprising a wiring electrically connected to the magnetic thin film.

15. The magnetic thermoelectric conversion element according to claim 14, wherein the magnetic thin film forms a plurality of thin wires extending in the first direction or in the second direction, the wiring includes a plurality of wirings, and the thin wires and the wirings are electrically connected in series.

16. A sensor comprising the magnetic thermoelectric conversion element according to claim 12.

17. A method for manufacturing a magnetic-thin-film-equipped substrate, the method comprising:

forming a magnetic thin film on one principal surface of a substrate; and heating the substrate and the magnetic thin film at a predetermined temperature, wherein a difference obtainable by subtracting a first dimensional change rate from a second dimensional change rate is 0.10% or more, the first dimensional change rate is a value obtainable, in a test of heating the substrate at 150° C. for 30 minutes, by dividing a dimension of the substrate measured at 25° C. after the test by a dimension of the substrate measured at 25° C. before the test, where both the dimensions are measured in a first direction along the principal surface of the substrate, and the second dimensional change rate is a value obtainable by dividing a dimension of the substrate measured at 25° C. after the test by a dimension of the substate measured at 25° C. before the test, where both the dimensions are measured in a second direction parallel to the principal surface of the substrate and perpendicular to the first direction.

* * * * *